(12) United States Patent
Nguyen

(10) Patent No.: US 12,120,856 B2
(45) Date of Patent: Oct. 15, 2024

(54) SERVICEABLE AND ACCESSIBLE LIQUID COOLED MODULES

(71) Applicant: NIO Technology (Anhui) Co., Ltd., Hefei (CN)

(72) Inventor: Anthony P. Nguyen, San Jose, CA (US)

(73) Assignee: NIO TECHNOLOGY (ANHUI) CO., LTD., Hefei (CN)

( * ) Notice: Subject to any disclaimer, the term of this patent is extended or adjusted under 35 U.S.C. 154(b) by 143 days.

(21) Appl. No.: 17/576,778

(22) Filed: Jan. 14, 2022

(65) Prior Publication Data

US 2023/0232596 A1    Jul. 20, 2023

(51) Int. Cl.
| | |
|---|---|
| *H05K 1/02* | (2006.01) |
| *H05K 1/14* | (2006.01) |
| *H05K 7/14* | (2006.01) |
| *H05K 7/20* | (2006.01) |

(52) U.S. Cl.
CPC ........... *H05K 7/20872* (2013.01); *H05K 1/14* (2013.01); *H05K 7/1427* (2013.01)

(58) Field of Classification Search
CPC .... H05K 7/20872; H05K 7/1427; H05K 1/14; G06F 1/20; G06F 1/181
See application file for complete search history.

(56) References Cited

U.S. PATENT DOCUMENTS

| | | | | |
|---|---|---|---|---|
| 5,761,043 A | * | 6/1998 | Salmonson | H05K 7/20772 361/784 |
| 5,986,887 A | * | 11/1999 | Smith | H05K 7/20509 174/16.3 |
| 7,149,087 B2 | | 12/2006 | Wilson et al. | |
| 8,537,540 B2 | * | 9/2013 | Landon | G06F 1/183 361/679.54 |
| 9,901,007 B1 | | 2/2018 | Reynov et al. | |
| 2007/0002536 A1 | * | 1/2007 | Hall | H05K 7/20754 361/695 |

(Continued)

FOREIGN PATENT DOCUMENTS

| | | | |
|---|---|---|---|
| CN | 106061213 A | * 10/2016 | |
| CN | 108275002 B | * 5/2020 | ................ B60L 3/12 |

OTHER PUBLICATIONS

Wei, 'Sensor Device For Electric Automobile', May 5, 2020, Zhejiang Kefeng Sensor Co., Ltd. (Translation of CN 108275002 B) (Year: 2020).*

(Continued)

*Primary Examiner* — Stephen S Sul
*Assistant Examiner* — Jeffrey Francis Stoll
(74) *Attorney, Agent, or Firm* — Sheridan Ross P.C.

(57) ABSTRACT

A removable subassembly is provided for use in a circuit board module. The removable subassembly includes a cooling element that is decoupled from an enclosure constructed for the circuit board module. The cooling element can be fastened directly to a daughter card or other printed circuit board of the electronic module and can act as part of the enclosure for the circuit board module. By having the cooling element fastened to the daughter card and being part of the enclosure, the daughter card or other components of the circuit board module can be removed without the need for a complete disassembly of the circuit board module.

20 Claims, 5 Drawing Sheets

(56) References Cited

U.S. PATENT DOCUMENTS

| | | | | |
|---|---|---|---|---|
| 2007/0070605 | A1* | 3/2007 | Straznicky | H05K 7/1461 |
| | | | | 257/E23.098 |
| 2009/0009959 | A1* | 1/2009 | Cheng | G06F 1/182 |
| | | | | 361/679.41 |
| 2010/0027220 | A1* | 2/2010 | Hughes | H05K 7/2049 |
| | | | | 361/702 |
| 2013/0021752 | A1* | 1/2013 | Campbell | H05K 7/20772 |
| | | | | 165/138 |
| 2016/0128226 | A1* | 5/2016 | Stellick | H05K 7/20727 |
| | | | | 361/679.46 |
| 2016/0165752 | A1* | 6/2016 | Pietrantonio | H05K 7/20927 |
| | | | | 165/121 |
| 2019/0385919 | A1* | 12/2019 | Hunka | H01L 23/10 |
| 2020/0174534 | A1* | 6/2020 | Ganta Papa Rao Bala | |
| | | | | G06F 1/181 |
| 2021/0105911 | A1* | 4/2021 | Yang | H05K 7/20509 |
| 2021/0168930 | A1* | 6/2021 | Hoskins | H05K 7/20927 |

OTHER PUBLICATIONS

Zhang, 'Automobile Interior Man-machine Interactive Display Screen Integrated Heat Radiation System And Radiation Method', Oct. 26, 2016, Shenzhen Zyic Technology Co., Ltd. (Translation of CN 106061213 A) (Year: 2016).*

Monro Live, "Volkswagen ID.4: Electric Motor Teardown and Analysis," YouTube, Jun. 7, 2021, transcript retrieved from https://youtu.be/3Bab6CttKEY?t=1530, 43 pages.

Monro Live, "Model Y E19: Center-mounted Pds, 12V power, and ADAS Hardware V3," YouTube, Apr. 15, 2020, transcript retrieved from https://youtu.be/llxAq7Q1Kb4?t=307, 18 pages.

* cited by examiner

SERVICEABLE AND ACCESSIBLE LIQUID COOLED MODULES

FIELD OF THE DISCLOSURE

The present disclosure is generally directed to electronic modules, in particular, toward serviceable and accessible liquid cooled modules.

BACKGROUND

Electronic modules usually include a printed circuit board (PCB) that sits inside an enclosure. If the electronic module has high power consumption and requires liquid cooling, the enclosure may be aluminum with cooling channels and paths built into the enclosure for coolant to flow through and remove heat from the electronic components of the electronic module. Because the cooling channels are part of the enclosure, if the PCB or a daughter card needs to be removed (e.g., for servicing or upgrading), the entire electronic module may be removed to open the assembly and extract the PCB or daughter card from the enclosure. Removing the entire electronic module to extract different components of the electronic module (e.g., the PCB or daughter card) is routine, conventional, and well-understood.

BRIEF SUMMARY

In an illustrative embodiment, a removable subassembly comprises a cooling element and a first circuit board secured to the cooling element, where the removable subassembly attaches to an enclosure storing a second circuit board, the second circuit board being electrically connected to the first circuit board.

In at least one embodiment, the cooling element provides at least a portion of an enclosing surface for the enclosure storing the second circuit board.

In at least one embodiment, a form factor of the cooling element corresponds to a layout of the first circuit board.

In at least one embodiment, the first circuit board is attached directly to the cooling element with one or more fasteners.

In at least one embodiment, the cooling element comprises a heat exchanger, a cold plate, or a combination thereof.

In at least one embodiment, the removable subassembly further comprises an input connection on the cooling element and an output connection on the cooling element, where the input connection and the output connection provide a flow of a coolant fluid through channels of the cooling element.

In at least one embodiment, the removable subassembly further comprises a gasket placed between the cooling element and the first circuit board.

In at least one embodiment, the removable subassembly attaches to the second circuit board and the enclosure via one or more fasteners.

In at least one embodiment, the first circuit board, the second circuit board, or both provide a function for a vehicle.

In at least one embodiment, the first circuit board comprises a daughterboard, a printed circuit board (PCB) daughter card, a PCB, or a combination thereof.

In an illustrative embodiment, a circuit board module comprises an enclosure; a first circuit board; and a first removable subassembly, where the first removable subassembly comprises a cooling element; and a second circuit board secured to the cooling element, the second circuit board being electrically connected to the first circuit board.

In at least one embodiment, the enclosure comprises a plastic material.

In at least one embodiment, the circuit board module further comprises a second removable subassembly, where the second removable subassembly comprises a second cooling element; and a third circuit board secured to the second cooling element, the third circuit board being electrically connected to the first circuit board.

In at least one embodiment, the first circuit board, the second circuit board, or both provide a function for a vehicle.

In at least one embodiment, a form factor of the enclosure is based at least in part on a size of the first circuit board, a number of removable subassemblies attached to the first circuit board, or a combination thereof.

In at least one embodiment, the cooling element of the first removable subassembly provides at least a portion of an enclosing surface for the enclosure.

In at least one embodiment, the first circuit board comprises a main PCB, a motherboard, or a combination thereof; and the second circuit board comprises a daughterboard, a PCB daughter card, an additional PCB, or a combination thereof.

In at least one embodiment, the circuit board module further comprises an input connection on the cooling element of the first removable subassembly; and an output connection on the cooling element of the first removable subassembly, where the input connection and the output connection provide a flow of a coolant fluid through channels of the cooling element.

In an illustrative embodiment, an apparatus comprises a cooling element and a first circuit board secured to the cooling element, where the apparatus attaches to an enclosure storing a second circuit board, the second circuit board being electrically connected to the first circuit board.

In at least one embodiment, the cooling element provides at least a portion of an enclosing surface for the enclosure storing the second circuit board.

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

Numerous additional features and advantages are described herein and will be apparent to those skilled in the art upon consideration of the following Detailed Description and in view of the figures.

BRIEF DESCRIPTION OF THE SEVERAL VIEWS OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

DETAILED DESCRIPTION

Figure 1:
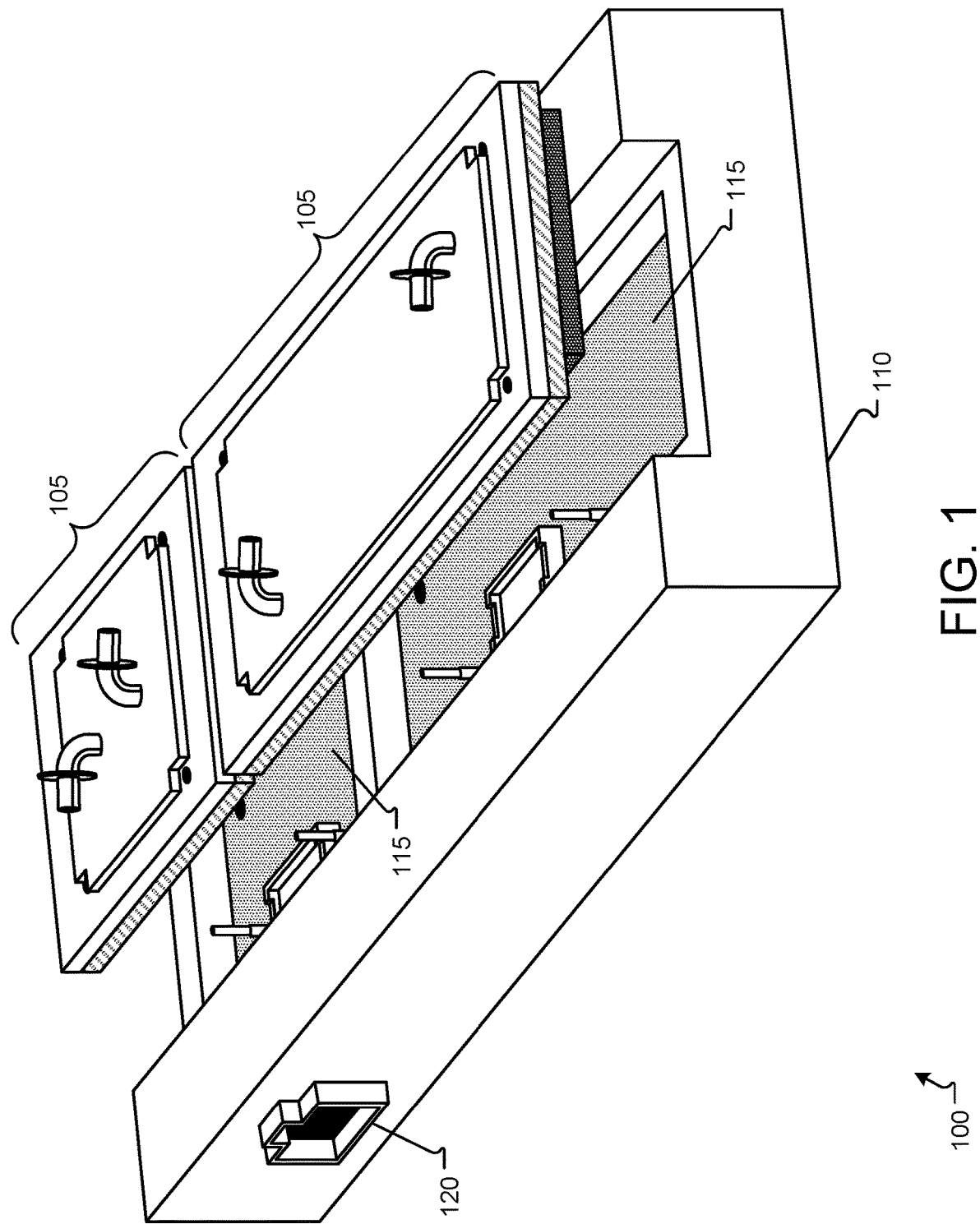
FIG. 1 shows a perspective view of a circuit board module in accordance with embodiments of the present disclosure.

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the present disclosure may use examples to illustrate one or more aspects thereof. Unless explicitly stated otherwise, the use or listing of one or more examples (which may be denoted by "for example," "by way of example," "e.g.," "such as," or similar language) is not intended to and does not limit the scope of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that may be schematic illustrations of idealized configurations.

Most electronic modules (e.g., electronic devices) generate heat while in use. This heat is typically generated by the flow of electric current through one or more resistive elements and/or components in the electronic module. When the heat generated by these elements and/or components is not efficiently removed, the temperatures of an electronic module can exceed a normal operating range. Operating electronics at temperatures outside of the normal operating range, even periodically, can cause premature failures and result in shorter component life spans.

The efficient thermal management of electronic components and modules generally requires one or more active and/or passive cooling elements. For example, typical microprocessors may generate heat that can be removed or dissipated via an attached heat sink and/or some other cooling element/system, such as a fan, directed cooled air, liquid cooling (or fluid cooling), etc. In this example, the heat generated may be routed to, and/or dissipated, into an environment immediately surrounding the microprocessors. With liquid cooling, a liquid (or a different type of fluid, such as a gas) is passed through a cooling element (e.g., the attached heat sink, such as a heat exchanger, cold plate, etc.) attached to the electronic module or that is part of the electronic module. The liquid absorbs heat generated in or by the electronic module (e.g., via one or more components in the electronic module) as the liquid flows through the cooling element, and the liquid (that has now absorbed the heat) is then output from the electronic module to dissipate the heat generated by the electronic module (e.g., external to the electronic module).

Electronic modules usually include a printed circuit board (PCB) that sits inside an enclosure. If the electronic module has high power consumption and requires liquid cooling, the enclosure may be aluminum with cooling channels and paths built into the enclosure for a coolant (e.g., a liquid for liquid cooling) to flow through and remove heat from electronic components of the electronic module. Because the cooling channels are part of the enclosure, if the PCB or a daughter card needs to be removed (e.g., for servicing or upgrading), the entire electronic module may be removed to open the assembly and extract the PCB or daughter card from the enclosure. Removing the entire electronic module to extract different components of the electronic module (e.g., the PCB or daughter card) is routine, conventional, and well-understood.

It is with respect to the above issues and other problems that the embodiments presented herein were contemplated.

As described herein, the cooling element of an electronic module is decoupled from the enclosure constructed for the electronic module, which allows the structure of the enclosure of the electronic module to be simple and can be made of different materials (e.g., plastic or other materials that are lighter than aluminum or other metals conventionally used for enclosures). The cooling element can be fastened directly to a daughter card or other PCB of the electronic module and can act as part of the enclosure for the electronic module. By having the cooling element fastened to the daughter card and being part of the enclosure, one or more parts of an enclosure can be eliminated that are typically needed for access to the daughter card (e.g., a removeable access cover). That is, having the cooling element on the exterior of the enclosure allows removal of the daughter card without the need for a complete disassembly of the electronic module, thereby increasing an ease of servicing or upgrading a daughter card or other components of an electronic module.

Referring now to FIG. 1, a perspective view of a circuit board module 100 (e.g., an electronic module) is shown in accordance with embodiments of the present disclosure. As described herein, the circuit board module 100 may include one or more removable subassemblies 105 that can be easily attached and removed from an enclosure 110 of the circuit board module 100. The enclosure 110 may provide housing for the removable subassemblies 105 and a PCB 115 (e.g., of the circuit board module 100). The removable subassembly 105 is described in greater detail with reference to FIGS. 2A-2C and 3.

The removable subassemblies 105 may attach to the PCB 115 (e.g., main PCB, motherboard, etc.) of the circuit board module 100. For example, the removable subassemblies 105 may include respective daughter cards (e.g., a second circuit board different than the PCB 115, such as a daughterboard, a PCB daughter card, an additional PCB, etc.) that are electrically connected to the PCB 115 (e.g., via headers, pin headers, sockets, board-to-board connectors, or additional types of connectors). Additionally, the PCB 115 may include one or more connection points 120 (e.g., ports attached to the PCB 115 that are accessible external to the enclosure 110 via cutouts on the enclosure 110 that accommodate the connection points 120) for providing power and/or signals to the circuit board module 100, providing connections (e.g., communications) between the circuit board module 100 and other modules or systems, etc.

Conventionally, if the circuit board module 100 uses a high amount of electrical current (e.g., consumes a high amount of power), the enclosure 110 is made of a metallic material (e.g., aluminum) with cooling channels and paths built into the enclosure 110 for coolant to flow through and remove heat from electronic components (e.g., daughter cards) of the circuit board module 100 (e.g., the heat is generated by the high amount of electric current flowing through the electrical components of the circuit board module 100). That is, the enclosure 110 is constructed to fully enclose all components of the circuit board module 100 and may be made of the metallic material for the cooling channels and paths to more efficiently absorb and dissipate the heat generated by the circuit board module 100.

However, because the cooling channels are part of the enclosure 110, if electrical components and/or a daughter card need to be removed (e.g., for servicing or upgrading), the entire circuit board module 100 may be removed (e.g., from a system of which the module is a part) to open the assembly and extract the components and/or daughter card from the enclosure 110. Additionally, having the enclosure 110 made of the metallic material increases the weight of the circuit board module 100, which may have additional implications for the system of which the circuit board module 100 is a part. As a non-limiting example, electric vehicles can include multiple circuit board modules that perform or manage various features of the electrical vehicle. Accordingly, as the weight of the electrical vehicle increases (e.g., based in part on the "heavier" metallic enclosures and modules used), a range that the electric vehicle can travel between being charged decreases.

By using the removable subassemblies 105 described herein for the circuit board module 100, the enclosure 110 can be made of different materials than metallic materials which had been previously needed for the cooling channels and paths. That is, with the cooling channels and paths (e.g., a cooling element) decoupled from the enclosure 110 (e.g., housing for the PCB 115), the enclosure 110 can be made of other materials besides cast aluminum, potentially offering weight and/or cost savings. For example, the enclosure 110 may be made of plastic, resulting in a lighter weight of the circuit board module 100. Additionally, the removable subassemblies 105 may include, in part, a cooling element (e.g., heat sink, heat exchanger, cold plate, etc.) that still allows for liquid cooling of electronic components within the circuit board module 100. This cooling element can also serve as part of the enclosing surface for the circuit board module 100. Additionally, the cooling element may include an input connection and an output connection for enabling the flow of the liquid across the removable subassemblies 105 and provide cooling for the circuit board module 100.

While two (2) removable subassemblies 105 are shown in the example of FIG. 1, it is understood that the circuit board module 100 can include one (1) removable subassembly 105 or more than two (2) removable subassemblies 105. With multiple removable subassemblies 105 as part of the circuit board module 100, each removable subassembly 105 may be electrically connected to the PCB 115 (e.g., a same PCB). Additionally or alternatively, while not shown, each removable subassembly 105 may be electrically connected to respective PCBs (e.g., different PCBs).

In some examples, a form factor of the enclosure 110 (e.g., size, shape, layout, or other physical specifications for the enclosure 110) may depend on a size (e.g., or other specifications) of the PCB 115, a number of removable subassemblies 105 attached to (e.g., electrically connected to) the PCB 115, or both. For example, the enclosure 110 may be machined or manufactured specifically to specifications of the PCB 115, the removable subassemblies 105, etc. Additionally, as described in greater detail with reference to FIGS. 2A-2C and 3, form factors of the removable subassemblies 105 (e.g., form factors of the cooling elements of the removable subassemblies 105) may depend on specifications (e.g., size, shape, layout, etc.) of daughter cards included in the removable subassemblies 105 or for which the removable subassemblies 105 are built.

Continuing the non-limiting example described previously, the removable subassemblies 105 (e.g., that include daughter cards) and/or the PCB 115 may provide one or more functions for an electrical vehicle. For example, the functions may include critical functions for the electric vehicle, such as autonomous driving operations, navigation, RADAR, vehicle controls, communications (e.g., vehicle-to-vehicle (V2V) or vehicle-to-everything (V2X) communications), etc. By having the enclosures of the circuit board modules be made of plastic or lighter materials than conventionally used metals, a weight of the electric vehicle is lessened, resulting in a greater range for which the vehicle can travel.

The electric vehicle described herein may include any conveyance or model of a conveyance, where the conveyance was designed for the purpose of moving one or more tangible objects, such as people, animals, cargo, and the like. The term "vehicle" does not require that a conveyance moves or is capable of movement. Typical vehicles may include but are in no way limited to cars, trucks, motorcycles, busses, automobiles, trains, railed conveyances, boats, ships, marine conveyances, submarine conveyances, airplanes, space craft, flying machines, human-powered conveyances, and the like.

Additionally or alternatively, the circuit board module 100 and the removable subassemblies 105 may provide services and functions for other embodiments. For example, the circuit board module 100 and the removable subassemblies 105 may provide functions for computers (e.g., for sound cards, video or graphics cards, etc.), machinery (e.g., automated machinery), robotics, smart devices, or other embodiments that use PCBs, daughter cards, or both.

Figure 2A:
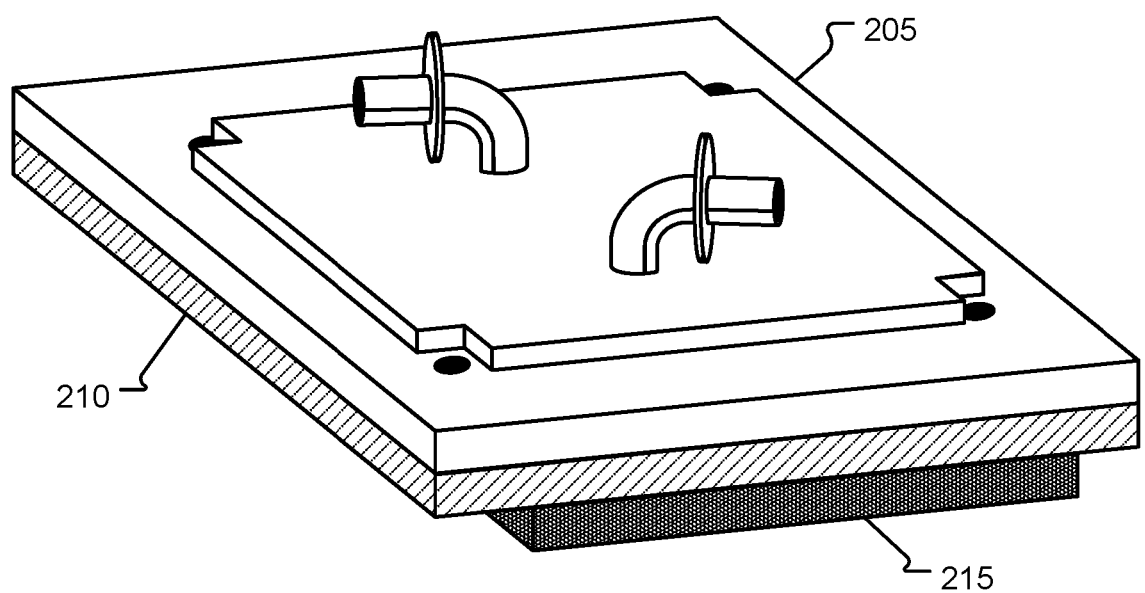
FIG. 2A shows a perspective view of a removable subassembly in accordance with embodiments of the present disclosure.
Figure 2B:
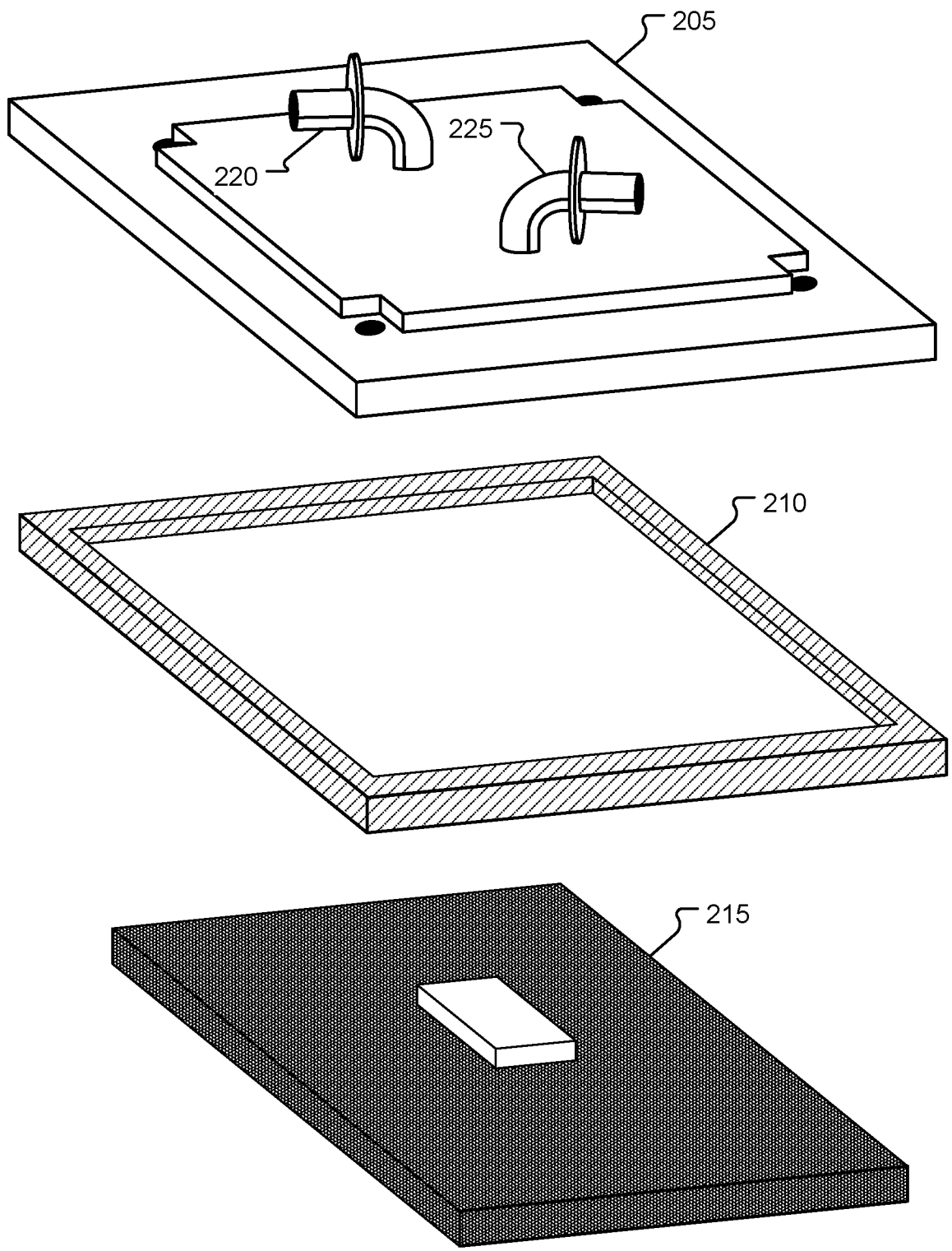
FIG. 2B shows an exploded perspective view of the removable subassembly in accordance with embodiments of the present disclosure.
Figure 2C:
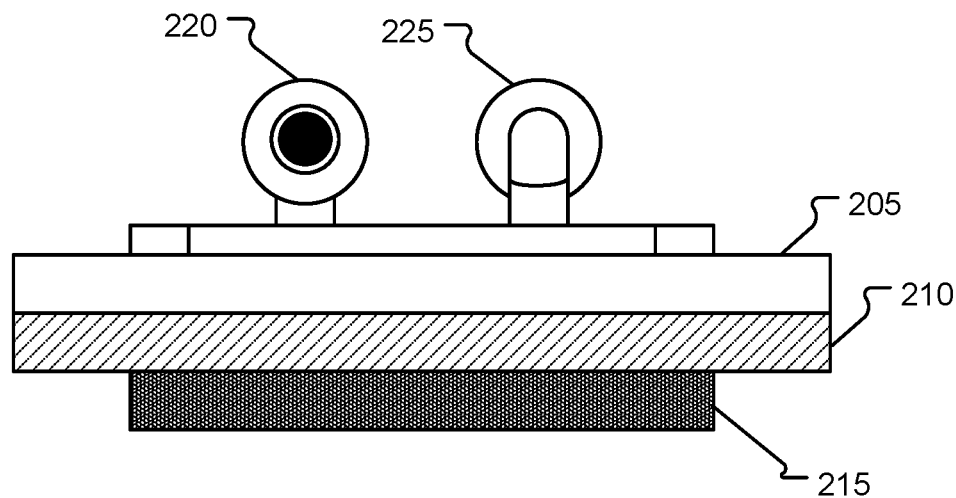
FIG. 2C shows a side view of the removable subassembly in accordance with embodiments of the present disclosure.

FIGS. 2A, 2B, and 2C show different views of a removable assembly in accordance with embodiments of the present disclosure. For example, FIG. 2A shows a perspective view 200 of the removable subassembly, FIG. 2B shows an exploded perspective view 201 of the removable subassembly, and FIG. 2C shows a side view 202 of the removable subassembly. The removable assembly shown and described with reference to FIGS. 2A, 2B, and 2C may correspond to the removable subassembly 105 as described with reference to FIG. 1.

As shown in FIG. 2A, the removable assembly as described herein includes multiple components. For example, the removable subassembly may include a cooling element 205 (e.g., a heat exchanger, a cold plate, etc.), a gasket 210, and a daughter card 215 (e.g., first circuit board, a daughterboard, a PCB daughter card, a PCB, etc.). As described previously with reference to FIG. 1, this removable subassembly may be designed to attach to an enclosure storing a second circuit board (e.g., a main PCB, a motherboard, an additional PCB, etc.), where the daughter card 215 is electrically connected to the second circuit board (e.g., via headers, pin headers, sockets, board-to-board connectors, or additional types of connectors). Additionally, the daughter card 215 may attach directly to the cooling element 205. For example, the daughter card 215 may attach directly to the cooling element 205 via one or more fasteners. Similarly, the removable subassembly may drop down and attach to the enclosure and/or the second circuit board via one or more fasteners (e.g., using holes drilled into the cooling element 205).

In some examples, the daughter card 215 may provide complementary or supplementary functions to the second circuit board stored in the enclosure to which the removable subassembly attaches. For example, the daughter card 215 is type of circuit board that plugs in or is attached to a motherboard or similar expansion card (e.g., the second circuit board) to extend features and services of the motherboard or similar expansion card. That is, the daughter card 215 may complement or supplement an existing functionality of a motherboard or an expansion card. As described previously, the daughter card 215 (and/or the second circuit board) may, in part, provide a function for a vehicle (e.g., electrical vehicle) but is not limited to such examples.

FIG. 2B shows the exploded perspective view 201 of the removable subassembly as shown and described with reference to FIG. 2A. The cooling element 205 represents an outer layer (e.g., first layer) of the removable assembly with the gasket 210 providing an intermediate layer (e.g., second layer) between the cooling element 205 and the daughter card 215, and the daughter card 215 providing a bottom layer (e.g., third layer) of the removable assembly. The gasket 210 provides a seal between the cooling element 205 and the daughter card 215 to dust or other particles from getting inside the circuit board module (e.g., electrical module) to which the removable assembly is attached. For example, the gasket 210 provides a seal between the cold plate 205 and an enclosure (e.g., the enclosure 110 as described and shown with reference to FIG. 1) storing the second circuit board.

Additionally, as described previously, the cooling element 205 may provide at least a portion of the enclosing surface for the enclosure storing the second circuit board that can be removed to access different components of the circuit board module (e.g., for upgrading, servicing, etc.), such as the daughter card 215. Alternatively, conventional circuit board modules may have cooling channels and paths built into one or more faces of the enclosure, such that a complete disassembly of the enclosure and circuit board module would be performed to access the daughter card 215 or additional features being built into or on the enclosure for the circuit board module, such as an access panel. That is, the cooling element 205 acts as an enclosure element, eliminating the need for access panels or covers that are typically needed to gain access and service internal components of the circuit board module.

The cooling element 205 may include a first connection 220 and a second connection 225, where the first connection 220 and the second connection 225 provide a flow of a coolant fluid through channels of the cooling element 205. The coolant fluid may enter the cooling element 205 as a cold fluid (e.g., through the first connection 220 or the second connection 225), absorb heat generated in the circuit board module (e.g., generated at least in part by the daughter card 215), and exit the cooling element 205 (e.g., through the opposite connection from which the coolant fluid enters the cooling element 205) now at least partially heated from the absorbed heat, where the heat is then dissipated external to the circuit board module.

In some examples, a form factor of the cooling element 205 may correspond to or be based at least in part on a size, shape, and/or layout of the daughter card 215. For example, the cooling element 205 may be manufactured specifically for the daughter card 215. Accordingly, if the daughter card 215 is being replaced with an upgraded PCB within the circuit board module, the removable assembly can be replaced wholly with a different removable assembly that includes a different cooling element manufactured specific to the upgraded PCB.

FIG. 2C shows the side view 202 of the removable subassembly in accordance with embodiments of the present disclosure. The cooling element 205 with the first connection 220 and the second connection 225 may be fastened to the daughter card 215 to provide cooling for components of the daughter card 215 (e.g., chips, microchips, capacitors, etc.) or for the daughter card 215 as a whole. The gasket 210 may be placed between the cooling element 205 and the daughter card 215 and may provide the seal between the cooling element 205 and the enclosure storing the second circuit board to which the daughter card 215 is electrically connected in the circuit board module.

Figure 3:
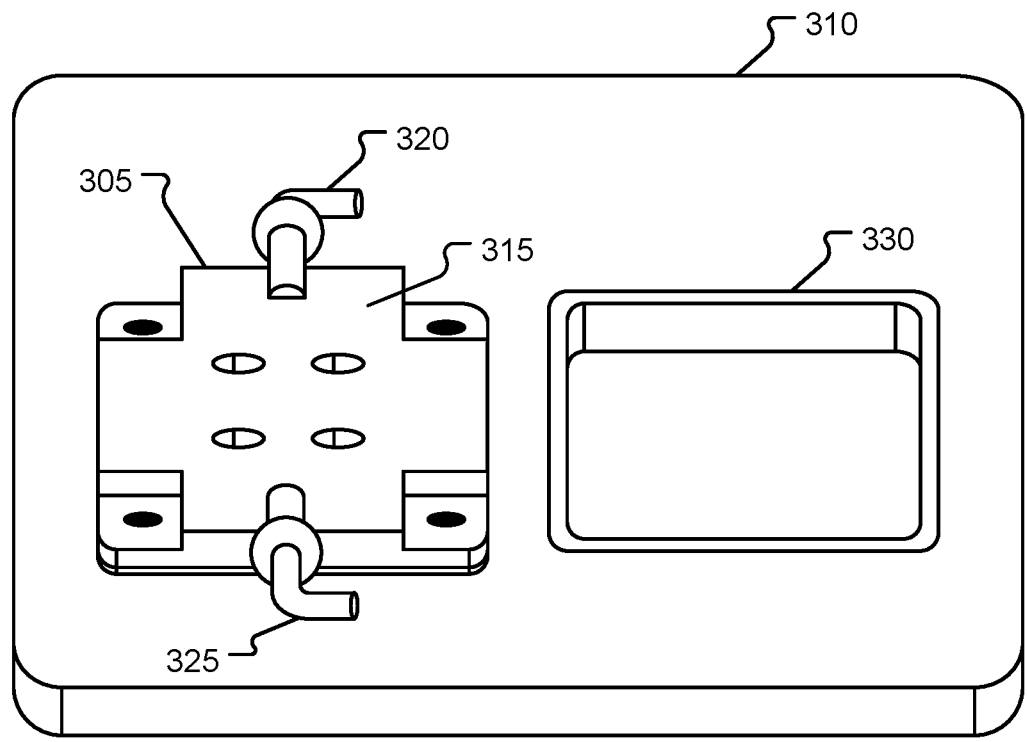
FIG. 3 shows a perspective view of an additional circuit board module in accordance with embodiments of the present disclosure.

FIG. 3 shows a perspective view of an additional circuit board module 300 in accordance with embodiments of the present disclosure. The additional circuit board module 300 illustrates a different configuration, system, and/or module for which a removable subassembly 305 can be used. The removable subassembly 305 may represent a removable subassembly as described herein and with reference to FIGS. 1 and 2A-2C. For example, the removable subassembly 305 can be removed from an enclosure 310 for the additional circuit board module 300 to access components of the additional circuit board module 300 (e.g., for maintenance, replacement, etc.). One of these components that can be accessed with the removal of the removable subassembly 305 includes a first circuit board (e.g., daughter card, daughterboard, PCB daughter card, PCB, etc.) that is electrically connected to a second circuit board of the additional circuit board module 300 (e.g., main PCB, motherboard, additional PCB, etc.).

Additionally, the removable subassembly 305 may include a cooling element 315 that is attached to the enclosure 310 (e.g., via one or more fasteners) with the cooling element 315 serving as at least a portion of an enclosing surface for the enclosure 310. The cooling element includes at least a first connection 325 and a second connection 320 (e.g., input and output connections) that provide a flow of coolant fluid to cool components of the additional circuit board module 300 (e.g., the first circuit board, the second circuit board, other components, etc.).

The additional circuit board module 300 and the enclosure 310 may include one or more openings to accommodate the removable subassemblies as described herein. For example, the removable subassembly 305 may be placed into an opening of the enclosure 310 not shown in the example of FIG. 3. The opening for the removable subassembly 305 may correspond to an opening 330 shown on the enclosure 310. The opening 330 may represent an opening where an additional removable subassembly (e.g., that includes at least a cooling element with attached daughter card) is removed from the enclosure 310 or a potential space for an additional removable subassembly to be placed into the enclosure 310 and the additional circuit board module 300.

It is understood that the removable subassembly as described herein can be used for different configurations, systems, and/or circuit board modules than those explicitly described and shown with reference to FIGS. 1-3. That is, the examples of circuit board modules (e.g., electronic modules) shown with reference to FIGS. 1-3 are not meant to be an exhaustive list of possible configurations, systems, and/or circuit board modules that can include a removable assembly.

Any of the steps, functions, and operations discussed herein can be performed continuously and automatically.

The exemplary systems and methods of this disclosure have been described in relation to a removable subassembly for use in a circuit board module or an electronic module. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description. The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Exemplary aspects are directed to a removable subassembly, the removable assembly comprising a cooling element and a first circuit board secured to the cooling element, wherein the removable subassembly attaches to an enclosure storing a second circuit board, the second circuit board being electrically connected to the first circuit board.

Any one or more of the above aspects include wherein the cooling element provides at least a portion of an enclosing surface for the enclosure storing the second circuit board.

Any one or more of the above aspects include wherein a form factor of the cooling element corresponds to a layout of the first circuit board.

Any one or more of the above aspects include wherein the first circuit board is attached directly to the cooling element with one or more fasteners.

Any one or more of the above aspects include wherein the cooling element comprises a heat exchanger, a cold plate, or a combination thereof.

Any one or more of the above aspects include wherein the removable assembly further comprises an input connection on the cooling element and an output connection on the cooling element, wherein the input connection and the output connection provide a flow of a coolant fluid through channels of the cooling element.

Any one or more of the above aspects include wherein the removable assembly further comprises a gasket placed between the cooling element and the first circuit board.

Any one or more of the above aspects include wherein the removable subassembly attaches to the second circuit board and the enclosure via one or more fasteners.

Any one or more of the above aspects include wherein the first circuit board, the second circuit board, or both provide a function for a vehicle.

Any one or more of the above aspects include wherein the first circuit board comprises a daughterboard, a PCB daughter card, a PCB, or a combination thereof.

Exemplary aspects are directed to a circuit board module, the circuit board module comprising an enclosure; a first circuit board; and a first removable subassembly, wherein the first removable subassembly comprises a cooling element and a second circuit board secured to the cooling element, the second circuit board being electrically connected to the first circuit board.

Any one or more of the above aspects include wherein the enclosure comprises a plastic material.

Any one or more of the above aspects include wherein the circuit board module further comprises a second removable subassembly, wherein the second removable subassembly comprises a second cooling element and a third circuit board secured to the second cooling element, the third circuit board being electrically connected to the first circuit board.

Any one or more of the above aspects include wherein the first circuit board, the second circuit board, or both provide a function for a vehicle.

Any one or more of the above aspects include wherein a form factor of the enclosure is based at least in part on a size of the first circuit board, a number of removable subassemblies attached to the first circuit board, or a combination thereof.

Any one or more of the above aspects include wherein the cooling element of the first removable subassembly provides at least a portion of an enclosing surface for the enclosure.

Any one or more of the above aspects include wherein the first circuit board comprises a main PCB, a motherboard, or a combination thereof; and the second circuit board comprises a daughterboard, a PCB daughter card, an additional PCB, or a combination thereof.

Any one or more of the above aspects include wherein the circuit board module further comprises an input connection on the cooling element of the first removable subassembly and an output connection on the cooling element of the first removable subassembly, wherein the input connection and the output connection provide a flow of a coolant fluid through channels of the cooling element.

Exemplary aspects are directed to an apparatus, the apparatus comprising a cooling element and a first circuit board secured to the cooling element, wherein the apparatus attaches to an enclosure storing a second circuit board, the second circuit board being electrically connected to the first circuit board.

Any one or more of the above aspects include wherein the cooling element provides at least a portion of an enclosing surface for the enclosure storing the second circuit board.

Any one or more of the above aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

Any one or more of the features disclosed herein.

Any one or more of the features as substantially disclosed herein.

Any one or more of the features as substantially disclosed herein in combination with any one or more other features as substantially disclosed herein.

Any one of the aspects/features/embodiments in combination with any one or more other aspects/features/embodiments.

Use of any one or more of the aspects or features as disclosed herein.

It is to be appreciated that any feature described herein can be claimed in combination with any other feature(s) as described herein, regardless of whether the features come from the same described embodiment.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together. When each one of A, B, and C in the above expressions refers to an element, such as X, Y, and Z, or a class of elements, such as $X_1$-$X_n$, $Y_1$-$Y_m$, and $Z_1$-$Z_o$, the phrase is intended to refer to a single element selected from X, Y, and Z, a combination of elements selected from the same class (e.g., $X_1$ and $X_2$) as well as a combination of elements selected from two or more classes (e.g., $Y_1$ and $Z_o$).

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," "compute," and variations thereof, as used herein, are used interchangeably and include any type of methodology, process, mathematical operation, or technique.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein.

What is claimed is:

1. A removable subassembly, comprising:
   a cooling element; and a first circuit board secured to the cooling element,
wherein the removable subassembly attaches to an enclosure storing a second circuit board, the second circuit board being electrically connected to the first circuit board,
wherein the first circuit board is provided between the cooling element and the second circuit board,
wherein the cooling element comprises a cold plate, and
wherein the removable subassembly is provided within a recess of the enclosure.

2. The removable subassembly of claim 1, wherein the cooling element provides at least a portion of an enclosing surface for the enclosure storing the second circuit board.

3. The removable subassembly of claim 1, wherein a form factor of the cooling element corresponds to a layout of the first circuit board.

4. The removable subassembly of claim 1, wherein the first circuit board is attached directly to the cooling element with one or more fasteners.

5. The removable subassembly of claim 1, further comprising:
an input connection on the cooling element; and
an output connection on the cooling element,
wherein the input connection and the output connection provide a flow of a coolant fluid through channels of the cooling element.

6. The removable subassembly of claim 1, further comprising:
a gasket placed between the cooling element and the first circuit board.

7. The removable subassembly of claim 1, wherein the removable subassembly attaches to the second circuit board and the enclosure via one or more fasteners.

8. The removable subassembly of claim 1, wherein the first circuit board, the second circuit board, or both provide a function for a vehicle.

9. The removable subassembly of claim 1, wherein the first circuit board comprises a daughterboard, a printed circuit board daughter card, a printed circuit board, or a combination thereof.

10. A circuit board module, comprising:
an enclosure;
a first circuit board; and
a first removable subassembly,
wherein the first removable subassembly comprises:
a cooling element; and
a second circuit board secured to the cooling element, the second circuit board being electrically connected to the first circuit board,
wherein the second circuit board is provided between the cooling element and the first circuit board,
wherein the cooling element comprises a cold plate, and
wherein the first removable subassembly is provided within a recess of the enclosure.

11. The circuit board module of claim 10, wherein the enclosure comprises a plastic material.

12. The circuit board module of claim 10, further comprising:
a second removable subassembly, wherein the second removable subassembly comprises:
a second cooling element; and
a third circuit board secured to the second cooling element, the third circuit board being electrically connected to the first circuit board.

13. The circuit board module of claim 10, wherein the first circuit board, the second circuit board, or both provide a function for a vehicle.

14. The circuit board module of claim 10, wherein a form factor of the enclosure is based at least in part on a size of the first circuit board, a number of removable subassemblies attached to the first circuit board, or a combination thereof.

15. The circuit board module of claim 10, wherein the cooling element of the first removable subassembly provides at least a portion of an enclosing surface for the enclosure.

16. The circuit board module of claim 10, wherein the first circuit board comprises a main printed circuit board, a motherboard, or a combination thereof; and the second circuit board comprises a daughterboard, a printed circuit board daughter card, an additional printed circuit board, or a combination thereof.

17. The circuit board module of claim 10, further comprising:
an input connection on the cooling element of the first removable subassembly; and
an output connection on the cooling element of the first removable subassembly,
wherein the input connection and the output connection provide a flow of a coolant fluid through channels of the cooling element.

18. An apparatus, comprising:
a cooling element; and
a first circuit board secured to the cooling element,
wherein the apparatus attaches to an enclosure storing a second circuit board, the second circuit board being electrically connected to the first circuit board,
wherein the first circuit board is provided between the cooling element and the second circuit board,
wherein the cooling element comprises a cold plate, and
wherein the apparatus is provided within a recess of the enclosure.

19. The apparatus of claim 18, wherein the cooling element provides at least a portion of an enclosing surface for the enclosure storing the second circuit board.

20. The apparatus of claim 18, wherein a form factor of the cooling element corresponds to a layout of the first circuit board.

* * * * *